United States Patent [19]

Schwabe et al.

[11] Patent Number: 4,459,741
[45] Date of Patent: Jul. 17, 1984

[54] METHOD FOR PRODUCING VLSI COMPLEMENTARY MOS FIELD EFFECT TRANSISTOR CIRCUITS

[75] Inventors: Ulrich Schwabe, Munich; Erwin Jacobs, Vaterstetten, both of Fed. Rep. of Germany

[73] Assignee: Siemens Aktiengesellschaft, Berlin & Munich, Fed. Rep. of Germany

[21] Appl. No.: 408,788

[22] Filed: Aug. 17, 1982

[30] Foreign Application Priority Data

Aug. 27, 1981 [DE] Fed. Rep. of Germany ....... 3133841

[51] Int. Cl.$^3$ ................... H07L 21/22; H07L 29/78; H07L 21/265
[52] U.S. Cl. .............................. 29/576 B; 29/571; 29/577 C; 148/1.5; 148/187; 357/42; 357/91
[58] Field of Search ................ 29/576 B, 571, 577 C; 148/1.5, 187; 357/42, 91

[56] References Cited

U.S. PATENT DOCUMENTS

| | | | |
|---|---|---|---|
| 4,084,311 | 4/1978 | Yasuoka et al. | 29/571 |
| 4,277,291 | 7/1981 | Cerofolino et al. | 148/1.5 |
| 4,282,648 | 8/1981 | Yu et al. | 29/571 |
| 4,314,857 | 2/1982 | Aitken | 148/1.5 |
| 4,315,781 | 2/1982 | Henderson | 148/1.5 |
| 4,369,072 | 1/1983 | Bakeman et al. | 148/1.5 |

OTHER PUBLICATIONS

L. C. Parrillo et al., "Twin-Tub CMOS—A Technology for VLSI Circuits", *IEDM Technical Digest*, (1980), Paper 29.1, pp. 752-755.

Y. Sakai et al., "High Packing Density, High Speed CMOS (Hi-CMOS) Device Technology", *Japanese Journal of Applied Physics*, vol. 18, Suppl. 18-1, (1978) pp. 73-78.

DeWitt Ong, "An All-Implanted CCD/CMOS Process", *IEEE Transactions On Electron Devices*, vol. ED-28 (1981), pp. 6-12.

Primary Examiner—Upendra Roy
Attorney, Agent, or Firm—Hill, Van Santen, Steadman & Simpson

[57] ABSTRACT

Analog or digital MOS circuits in VLSI technology are produced by a method in which the manufacture of two troughs (5, 8) occurs with only one mask (3) used in production of the p-trough (5). The n-trough (8) is formed by a surface-wide implantation (7) of an ion selected from a group consisting of P, As and Sb. The channel implantation of the p-transistors occurs simultaneously. The field (11) and channel (12) implantation of the n-channel transistors is carried out with a silicon nitride mask (9), i.e., a LOCOS mask, and a double boron implantation (10a, 10b). The field implantation (16) of the p-channel transistors is carried out with arsenic (15). Advantages of this process sequence include reduction of parasitic edge capacitances at the source/drain edges with fewer masking steps.

8 Claims, 6 Drawing Figures

METHOD FOR PRODUCING VLSI COMPLEMENTARY MOS FIELD EFFECT TRANSISTOR CIRCUITS

BACKGROUND OF THE INVENTION

1. Field of the Invention

The invention relates to VLSI complementary MOS field effect transistor circuits and somewhat more particularly to an improved method for producing such circuits.

2. Prior Art

In known methods for manufacturing highly integrated complementary MOS field effect transistor circuits (CMOS circuits), multiple implantations, according to different technologies which are very involved, are employed for defining the various transistor threshold voltages.

Thus, L. C. Parillo et al, "Twin-Tub CMOS-A Technology for VLSI Circuits", *IEDM Technical Digest*, (1980), Paper 29.1, pages 752–755 suggests a process of producing two n- or, respectively, p-doped tubs in a CMOS process by a self-adjusting process step with the use of only one mask. A disadvantage of the self-adjusting implantation of two tubs is that it leads to a compensation of the two n- or p-implanted regions at the implantation edge. A negative consequence of this is that the threshold voltage of the thick oxide transistor (in the field oxide region) is reduced and current amplification of lateral parasitic pnp bipolar transistors is increased, which leads to an increased "latch-up" probability (that is the trigger probability of the parasitic thyristor). The reduction of the thick oxide threshold voltage, as well as "latch-up" lead to an outage of the particular component.

Another prior art technique which performs both the two tub production as well as the channel and field implantation with the use of separate masks is suggested by Y. Sakai et al, "High Packing Density, High Speed CMOS (Hi-CMOS) Device Technology", *Japanese Journal of Applied Physics*, Vol. 18, Supplement 18-1, (1978) pages 73–78. A disadvantage of this technique is that the CMOS manufacturing process, already critical in regard to yield, is greatly burdened by a plurality of required masking steps.

DeWitt Ong, "An All-Implanted CCD/CMOS Process", *IEEE Transactions on Electron Devices*, Vol. ED-28 (1981) pages 6–12 suggests the use of phosphorus as a doping material for the n-doping field implantation. Such phosphorus implantation produces a defined, lateral out-diffusion which leads to increases of parasitic edge capacitances at the edges of the adjacent source/drain regions. This has a negative effect on the circuit as a result of an increase of the switching times/access times.

SUMMARY OF THE INVENTION

The invention provides a method for producing highly integrated complementary MOS field effect transistor circuits (CMOS circuits) in which p- or, respectively n-doped troughs or tubs are generated in a semiconductor substrate for the acceptance of the n- or p-channel transistors of the circuit, into which appropriate dopant element atoms are introduced for defining or setting the various transistor threshold voltages by a multiple ion implantation, with the masking for the individual ion implantations occuring by means of appropriate photoresist structures or silicon oxide structures or silicon nitride structures and in which the manufacture of source/drain and gate regions as well as the formation of the intermediate oxide and track level is undertaken according to known steps of the MOS technology.

The invention provides a technique for preforming a CMOS process in which as few process steps as possible are utilized for manufacturing the desired circuits, but in which, nonetheless, it is guaranteed that the manner of functioning of the respective components of the circuits is not negatively influenced.

In order to overcome the above prior art disadvantages, it is a significant feature of the invention to dispense with the requirement for using an extra mask for the n-troughs and to respectively employ only a single mask for the field and channel implantation of the n-channel transistors and the p-channel transistors.

In accordance with the principles of the invention, a method of the type above described is improved by a sequence of the following steps:

(a) producing a p-trough by a boron implantation in a n-doped semiconductor substrate after completion of masking of remaining regions with an oxide mask;

(b) stripping the oxide mask;

(c) producing a n-trough and doping the p-channel by a surface-wide implantation of ions selected from the group consisting of phosphorus, arsenic and antimony;

(d) depositing a silicon nitride layer in a layer thickness and structuring the same in such a manner that it is matched to a subsequent boron implantation so that regions in which channel transistors are later generated remain covered by the nitride layer;

(e) forming a first photoresist process so that all regions outside of the p-trough regions remain covered with first photoresist structures;

(f) conducting a double boron implantation process whereby a first boron implantation is carried out at a relatively low energy level for doping the field regions, with such first implantation being masked by the silicon nitride layer, and a second boron implantation is carried out at a relatively higher energy level for doping the n-channel, with the second implantation not being masked by the silicon nitride layer;

(g) forming a second photoresist process after removal of the first photoresist structures so that all regions outside of the n-trough regions remain covered with second photoresist structures;

(h) forming an arsenic implantation for doping field regions of the p-channel transistors;

(i) stripping the second photoresist structures;

(k) forming field oxide regions by topical oxidation with employment of the silicon nitride layer as masking; and (l) stripping the silicon nitride mask.

In certain embodiments of the invention, a surface-wide oxide layer is formed on the substrate surface so as to protect such surface before the surface-wide ion-implantation for producing the n-trough and for doping the p-channel.

In certain embodiments of the invention, the semiconductor substrate is either a n-doped silicon oriented in the $<100>$ direction and having a resistance ranging from about 10 to about 50 ohm cm, or is a similar epitaxial layer on a $n^+$-doped silicon substrate.

In certain embodiments of the invention, the surface-wide implantation of a select ion occurs at a dose level ranging from about $5 \cdot 10^{10}$ to about $5 \cdot 10^{11}$ cm$^{-2}$ and at an energy level ranging from about 25 to about 200 keV.

In certain embodiments of the invention, the double boron implantation occurs so that the first boron implantation is at a dose level ranging from about $3 \cdot 10^{12}$ to about $5 \cdot 10^{13}$ cm$^{-2}$ and at an energy level ranging from about 10 to about 35 keV and the second boron implantation is at a dose level ranging from about $1 \cdot 10^{11}$ to about $2 \cdot 10^{12}$ cm$^{-2}$ and at an energy level ranging from about 50 to about 150 keV.

In certain embodiments of the invention, the arsenic implantation during step (h) occurs at a dose level ranging from about $5 \cdot 10^{11}$ to about $1 \cdot 10^{13}$ cm$^{-2}$ and at an energy level ranging from about 60 to about 180 keV.

In certain embodiments of the invention, the silicon nitride layer is deposited in a thickness ranging from about 60 to about 180 nm.

In certain preferred embodiments of the invention, the silicon nitride layer is deposited in a layer thickness of about 120 nm and during the double boron implantation, the first boron implantation occurs at a dose level of about $1 \cdot 10^{13}$ cm$^{-2}$ and at an energy level of about 25 keV and the second boron implantation occurs at a dose level of about $8 \cdot 10^{11}$ cm$^{-2}$ and at an energy level of about 80 keV.

DESCRIPTION OF PREFERRED EMBODIMENTS

Figure 1:
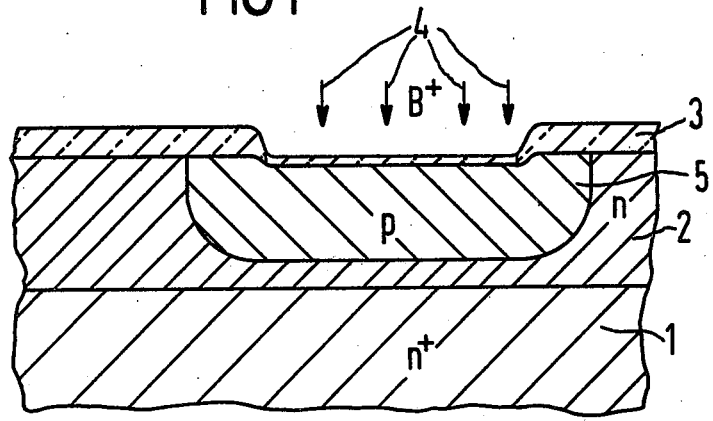
FIGS. 1-6 are partial, elevated, cross-sectional, somewhat schematic views of a circuit undergoing manufacture in accordance with the principles of the invention and illustrates structures attained by the method steps essential to the invention.

In the drawings, identical reference numerals are utilized to identify the same part throughout the various Figures, except as noted otherwise.

FIG. 1:

A p-trough or tub 5 is produced at the beginning of the process sequence. In order to achieve this, one proceeds from a n-doped silicon substrate 1, which may be either a n-doped silicon wafer oriented in the <100> direction and having a resistance ranging from about 10 to about 50 ohm cm or, as illustrated, a n epitaxial layer 2 on such an oriented n+ silicon substrate. The upper surface of the substrate (1 or 2) is provided with a masking oxide 3 having a thickness of about 700 nm and structured with the assistance of a photoresist process (not illustrated). A boron implantation, schematically indicated at 4, for generating the p-trough 5 occurs at a dose and energy level in the range of about $2 \cdot 10^{12}$ to about $1 \cdot 10^{13}$ cm$^{-2}$ and about 25 keV to about 180 keV, respectively. After the doping substance atoms for the p-troughs 5 (6000 nm) have been driven-in, the arrangement shown in FIG. 1 is attained.

FIG. 2:

The oxide layer 3 is entirely removed and a scatter oxide layer 6 is grown on the substrate surface (1, 2) in a layer thickness of about 50 nm. A surface-wide ion implantation, schematically indicated at 7, of an ion selected from the group consisting of phosphorus, arsenic or antimony then occurs for generating the p-channel and the n-trough 8.

Figure 2:
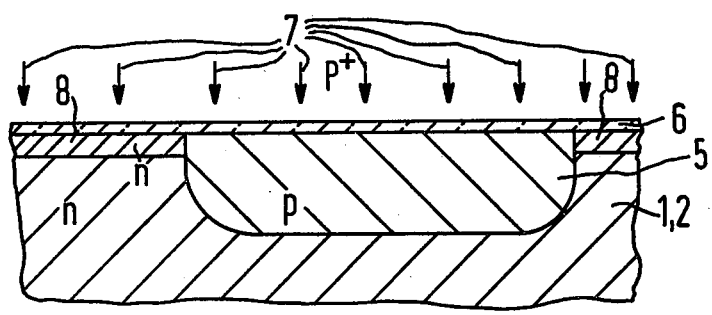
Figure 3:
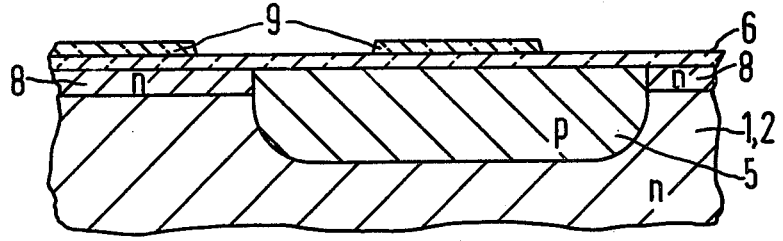
Figure 4:
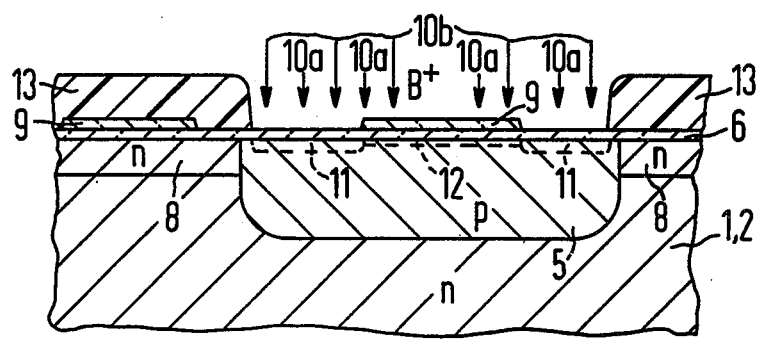
Figure 5:
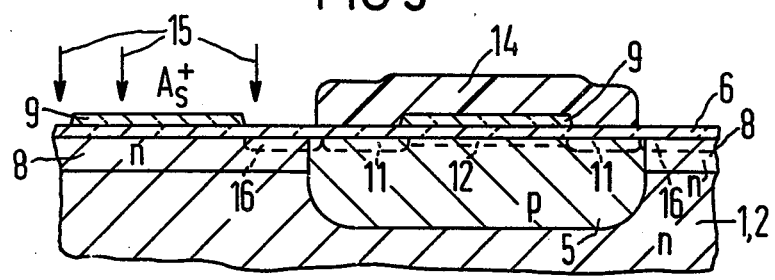
Figure 6:
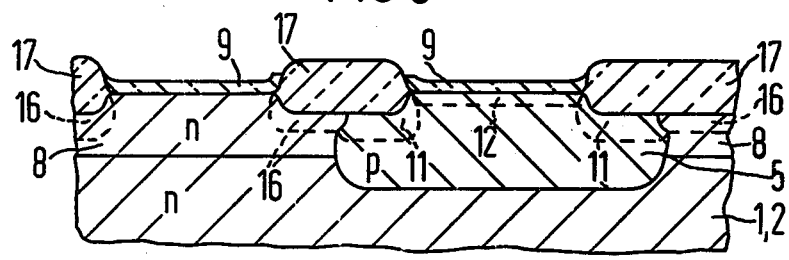

As can be seen from FIGS. 1 and 2, the manufacture of the two troughs 5 and 8 occurs with only one mask, however while avoiding the self-adjusting step (as occurs in certain embodiments of the Parillo et al technique) which is disadvantageous in circuit-technical terms. The n-trough 8 is formed without a separate masking step by means of the surface-wide phosphorus, arsenic or antimony implantation 7 (at a dose level ranging from about $7 \cdot 10^{10}$ to about $2 \cdot 10^{11}$ cm$^{-2}$ and at a energy level ranging from about 25 to about 200 keV, preferably at about 160 keV), with a subsequent diffusion. The disadvantages of a self-adjusting trough production process are thus eliminated. Simultaneously, the threshold voltage of p-channel transistor is set with the ion implantation 7, preferably phosphorus or arsenic. In this manner, a masking step is eliminated. A further substantial advantage is that the otherwise standard high dose compensation implantation into the channel region, which would lead to a reduction of the breakthrough voltage (p-channel transistors), is eliminated.

FIG. 3:

After implantation of the phosphorus, arsenic or antimony atoms, for forming the n-trough 8, a silicon nitride layer is deposited in a thickness of about 60 to about 180 nm, preferably about 120 nm and structured so as to form a nitride mask 9 (mask LOCOS).

FIG. 4:

Next, the field and channel implantation of the n-channel transistors is carried with only one mask (LOCOS mask 9) and a double boron implantation, schematically indicated at 10a and 10b, then occurs. The thickness of the LOCOS nitride mask 9 is adjusted in such a manner that a first, relatively low energy boron implantation 10a (at a dose level ranging from about $3 \cdot 10^{12}$ to about $5 \cdot 10^{13}$ cm$^{-2}$ and preferably at about $1 \cdot 10^{13}$ cm$^{-2}$ and at energy level ranging from about 10 to about 35 keV, and preferably at about 25 keV) is fully masked and only the field regions 11 are implanted. A second, relatively higher energy boron implantation 10b is controlled in such a manner that both the threshold voltage of the n-channel thin-oxide transistors, as well as that of the thick oxide transistors (doubly implanted field regions) are controlled with definition. All regions outside of the p-trough regions 5 are covered with a first photoresist structure 13 (produced with a first photoresist process) just prior to the boron implantations 10a and 10b.

FIG. 5:

After removal of the first photoresist structure 13, a second photoresist structure 14 is formed by a second photoresist process so that all regions outside of the n-trough regions 8 are covered with the second photoresist structures 14. The field implantation 16 of the p-channel transistors now occurs with an implantation of arsenic ions, schematically indicated at 15 (at a dose level ranging from about $5 \cdot 10^{11}$ to about $1 \cdot 10^{13}$ cm$^{-2}$ and at energy level ranging from about 16 to about 180 keV). As a result of the smaller diffusion coefficient of arsenic, in comparison to the typically utilized phosphorus (for example as suggested in the DeWitt Ong process described above), the later out-diffusion is significantly weaker. In this manner, the parasitic capacitances at the edges of the source/drain regions are reduced by about 20 to about 30%. Such a reduction provides a significant improvement in switching times.

FIG. 6:

After stripping the second photoresist structures 14, the field oxide regions 17 are formed in a layer thickness of about 1000 nm by a topical oxidation, with employment of the silicon nitride mask 9. After removal of the nitride mask 9, all further process steps can occur in accordance with known steps of the CMOS technology.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative it is not to be construed or interpreted as being restrictive or otherwise limiting of the present invention, excepting as it is set forth and defined in the hereto-appended claims.

We claim as our invention:

1. In a method of producing VLSI complementary MOS field effect transistor circuits (CMOS circuits) during which p- or n-doped troughs are formed in a semiconductor substrate for acceptance of n- or p-channel transistors of the circuits, said troughs having corresponding doping element atoms introduced therein by multiple ion implantation for defining different transistor threshold voltages and masking for the individual ion implantation occurs by structures composed of a material selected from a group consisting of photoresist, silicon oxide and silicon nitride, and in which the production of source/drain and gate regions as well as formation of intermediate and insulating oxides and interconnect level occurs in accordance with known steps of MOS technology, wherein the improvement comprises a sequence of the following steps:

(a) producing a p-trough (5) by a boron implantation (4) in a n-doped substrate (1, 2) after completion of masking of remaining regions with an oxide mask (3);

(b) stripping the oxide mask (3);

(c) producing a n-trough (8) and doping the p-channel by a surface-wide implantation (7) of an ion selected from a group consisting of phosphorus, arsenic and antimony;

(d) depositing a silicon nitride layer (9) in a layer thickness and etching said layer in such a manner that it is matched to a subsequent boron implantation (10a, 10b) so that regions in which channel transistors are later formed remain covered by the nitride layer (9);

(e) forming a first photoresist process so that all regions outside of the p-trough regions (5) remain covered with first photoresist structures (13);

(f) conducting a double boron implantation process (10a, 10b) whereby a first boron implatation (10a) is carried at a relatively low energy level for doping the field regions (11), said first implantation being masked by said silicon nitride layer (9) and a second boron implantation (10b) is carried out at a relatively higher energy level for doping the n-channel (12), said second implantation not being masked by said silicon nitride layer (9);

(g) forming a second photoresist process after removal of said first photoresist structures (13) so that all regions outside of the n-trough regions (8) remain covered with second photoresist structures (14);

(h) forming an arsenic implantation (15) for doping field regions (16) of the p-channel transistors;

(i) stripping the second photoresist structures (14);

(k) forming field oxide regions (17) by topical oxidation with employment of the silicon nitride layer (9) as masking; and (l) stripping the silicon nitride mask (9).

2. In a method as defined in claim 1, wherein a surface-wide oxide layer (6) is formed on the substrate surface before step (c) of producing the n-trough (8) and doping of the p-channel.

3. In a method as defined in claim 1, wherein said substrate is either a n-doped silicon wafer oriented in the $<100>$ direction and having a resistance ranging from about 10 to about 50 ohm cm, or is such an epitaxial layer (2) on a $n^+$-doped silicon substrate (1).

4. In a method as defined in claim 1, wherein step (c), surface-wide implantation of an ion, occurs at a dose level ranging from about $5 \cdot 10^{10}$ to about $5 \cdot 10^{11}$ cm$^{-2}$ and at a energy level ranging from about 25 to about 200 keV.

5. In a method as defined in claim 1, wherein during step (d), the silicon nitride layer is deposited in a thickness ranging from about 60 to about 180 nm.

6. In a method as defined in claim 1, wherein during step (f), double boron implantation, said first boron implantation (10a) occurs at a dose level ranging from about $3 \cdot 10^{12}$ to about $5 \cdot 10^{13}$ cm$^{-2}$ and at an energy level ranging from about 10 to about 35 keV and said second boron implantation (10b) occurs at a dose level ranging from about $1 \cdot 10^{11}$ to about $2 \cdot 10^{12}$ cm$^{-2}$ and at an energy level ranging from about 50 to about 150 keV.

7. In a method as defined in claim 1, wherein during step (d), the silicon nitride layer (9) is deposited in a layer thickness of about 120 nm and wherein during step (f) said first boron implantation (10a) occurs at a dose level of about $1 \cdot 10^{13}$ cm$^{-2}$ and at an energy level of about 25 keV and said second boron implantation (10b) occurs at a dose level of about $8 \cdot 10^{11}$ cm$^{-2}$ and at an energy level of about 80 keV.

8. In a method as defined in claim 1, wherein during step (h), said arsenic implantation occurs at a dose level ranging from about $5 \cdot 10^{11}$ to about $1 \cdot 10^{13}$ cm$^{-2}$ and at an energy level ranging from about 60 to about 180 keV.

* * * * *